(12) United States Patent
Huang et al.

(10) Patent No.: US 10,522,723 B1
(45) Date of Patent: Dec. 31, 2019

(54) FAN-OUT WAFER LEVEL LIGHT-EMITTING DIODE PACKAGE METHOD AND STRUCTURE THEREOF

(71) Applicant: EXCELLENCE OPTO. INC., Chunan Town, Miaoli County, Hsinchu Science Park (TW)

(72) Inventors: Kuo-Hsin Huang, Chunan Town (TW); Chung-Yu Chou, Chunan Town (TW); Tzeng-Guang Tsai, Chunan Town (TW); Yung-Hsiang Chao, Chunan Town (TW)

(73) Assignee: Excellence Opto. Inc., Hsinchu Science Park (TW)

( * ) Notice: Subject to any disclaimer, the term of this patent is extended or adjusted under 35 U.S.C. 154(b) by 0 days.

(21) Appl. No.: 16/194,890

(22) Filed: Nov. 19, 2018

(51) Int. Cl.
| | |
|---|---|
| *H01L 33/52* | (2010.01) |
| *H01L 33/62* | (2010.01) |
| *H01L 21/66* | (2006.01) |
| *H01L 25/075* | (2006.01) |

(52) U.S. Cl.
CPC ............ *H01L 33/52* (2013.01); *H01L 22/14* (2013.01); *H01L 25/0753* (2013.01); *H01L 33/62* (2013.01); *H01L 2933/005* (2013.01); *H01L 2933/0033* (2013.01); *H01L 2933/0066* (2013.01)

(58) Field of Classification Search
CPC ......... H01L 33/52; H01L 33/62; H01L 22/14; H01L 25/0753; H01L 2933/005; H01L 2933/0066; H01L 2933/0033
See application file for complete search history.

(56) References Cited

U.S. PATENT DOCUMENTS

| | | | |
|---|---|---|---|
| 2012/0146066 A1* | 6/2012 | Tischler | H01L 27/156 257/89 |
| 2016/0190400 A1* | 6/2016 | Jung | H01L 33/486 362/97.1 |
| 2017/0092820 A1* | 3/2017 | Kim | H01L 25/0753 |
| 2017/0141278 A1* | 5/2017 | Hamaguchi | H01L 33/62 |

* cited by examiner

*Primary Examiner* — Selim U Ahmed
(74) *Attorney, Agent, or Firm* — Muncy, Geissler, Olds & Lowe, P.C.

(57) ABSTRACT

A fan-out wafer level light-emitting diode package method for packaging a plurality of light-emitting diode chips on a wafer protective film, the method comprising: forming a package surface layer on first electrodes of the light-emitting diode chips, and then forming a plurality of leading electrodes electrically connected to the first electrodes on the package surface layer, cutting the light-emitting diode chips, sorting and testing as well as regrouping the light-emitting diode chips, covering sides of the light-emitting diode chips with a package layer, drilling and filling a conductive material on the package layer to form a plurality of common electrodes, and then printing a plurality of common electrical circuits, electrically connecting each of the common electrical circuits to one of the common electrodes and the leading electrodes, and finally covering with a circuit protection layer to complete the process.

10 Claims, 11 Drawing Sheets

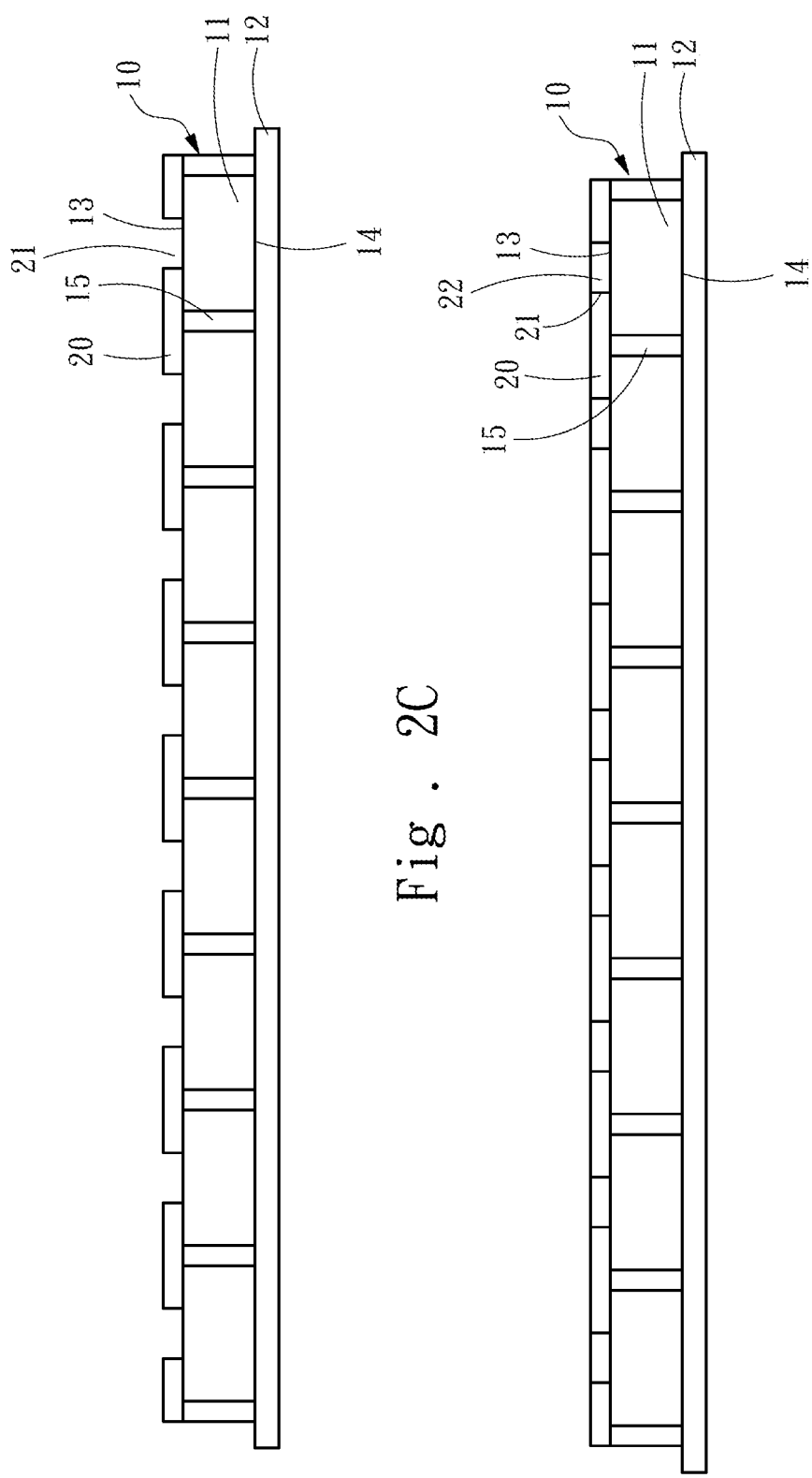

FAN-OUT WAFER LEVEL LIGHT-EMITTING DIODE PACKAGE METHOD AND STRUCTURE THEREOF

FIELD OF THE INVENTION

The present invention relates to light-emitting diode, and more particularly to a light-emitting diode package structure and a method thereof.

BACKGROUND OF THE INVENTION

The conventional light-emitting diode package method is done by using wire bond to connect the electrodes of a light-emitting diode and a package substrate. Since it needs to be wire bonded one by one, there is a problem that the production speed and yield rate cannot meet the requirements for multi-chips applications; and wire bond is difficult to meet the requirement of reduction in volume, the impedance is high, and it is difficult to meet the application requirements of light, thin, small and high brightness.

The emergence of flip chip package technology solves the problem that the volume is difficult to shrink, which can greatly reduce the volume after packaging, and meet the requirements of light, thin, small and high brightness.

However, in the flip chip package process, the chip needs to be precisely positioned, drawn and released for placing at a specified position on the package substrate. However, since the size of the light-emitting diode chip is getting smaller and smaller, the stability of sucking the chip for transfer is poor. It is easy to have abnormalities such as chip spin, offset, material drop, etc. The size of the aperture of the suction nozzle is very small in order to match the size of the chip, and it is easy to have a problem that the suction nozzle is blocked and the suction is insufficient, which leads to waste of production efficiency and increases of production costs.

SUMMARY OF THE INVENTION

Therefore, a main object of the present invention is to disclose a method of package process for packaging light-emitting diode chips on a wafer protective film.

A secondary object of the present invention is to disclose a package structure formed by packaging light-emitting diode chips directly on a wafer protective film.

The present invention is a fan-out wafer level light-emitting diode package method for packaging a plurality of light-emitting diode chips. The plurality of light-emitting diode chips are not separated and assembled to form a wafer, the wafer is adhered on a wafer protective film, and each of the plurality of light-emitting diode chips has a first electrode on an upper side and a second electrode on a lower side, and the package method comprising:

step S1: covering with an encapsulant, step S2: drilling blind holes, step S3: forming leading electrodes, step S4: cutting, step S5: sorting and testing, step S6: constructing a package body, step S7: forming common electrodes, step S8: forming common electrical circuits, and step S9: forming a circuit protection layer.

Step S1: covering the wafer with a package surface layer, and the package surface layer covering the first electrodes of the plurality of light-emitting diode chips;

step S2: drilling on the package surface layer corresponding to positions of the plurality of light-emitting diode chips to form the blind holes, and the blind holes exposing the first electrodes of the plurality of light-emitting diode chips;

step S3: filling a conductive material in the blind holes respectively to form the leading electrodes, and electrically connecting the leading electrodes to the first electrodes of the plurality of light-emitting diode chips respectively;

step S4: cutting the wafer to separate the plurality of light-emitting diode chips into single individuals;

step S5: testing the light-emitting diode chips, rejecting the damaged light-emitting diode chips, grouping and rearranging the remaining light-emitting diode chips on the wafer protective film, defining the wafer protective film into a plurality of package regions, and locating the light-emitting diode chips of a same group on the same package region;

step S6: forming a package layer on the wafer protective film, the package layer covering sides of the plurality of light-emitting diode chips, and the package layer and the package surface layer having a same height to form a coplane;

step S7: drilling holes on the package layer of each of the plurality of package regions to form a plurality of through holes on the package layer, and filling a conductive material in the through holes to form the common electrodes;

step S8: simultaneously printing the common electrical circuits on the package layer and the package surface layer, disposing one of the common electrical circuits on each of the plurality of package regions correspondingly, and electrically connecting the common electrical circuit to the common electrodes and the leading electrodes in the package region; and step S9: forming the circuit protection layer on the package layer and the package surface layer, and the circuit protection layer covering the leading electrodes, the common electrodes and the common electrical circuits on the package layer and the package surface layer.

According to the above method, after the cutting, a fan-out wafer level light-emitting diode package structure can be formed, which comprises at least two of the light-emitting diode chips, the package surface layer, at least two of the leading electrodes, the package layer, the common electrode, the common electrical circuit, and the circuit protection layer.

Each of the light-emitting diode chips has a first electrode on an upper and a second electrode on a lower side, and the package surface layer covers the first electrodes of the light-emitting diode chips; the package surface layer has at least two blind holes, the blind holes penetrate through the package surface layer corresponding to positions of the light-emitting diode chips, and expose the first electrodes of the light-emitting diode chips; and the leading electrodes are filled in the blind holes, and the leading electrodes are respectively electrically connected to the first electrodes of the light-emitting diode chips.

The package layer covers sides of the light-emitting diode chips, the package layer and the package surface layer have a same height to form a coplane, and the package layer has a through hole penetrating through two sides; the common electrode is filled in the through hole; the common electrical circuit is disposed on the package layer and the package surface layer, and the common electrical circuit is electrically connected to the common electrodes and the leading electrodes; and the circuit protection layer covers the leading electrodes, the common electrode and the common electrical circuit on the package layer and the package surface layer.

As described above, the packaging process is directly done on the wafer protective film without using a package substrate, and the costs can be reduced and the speed of process production can be improved by means of the printed circuits to meet the requirements of production.

BRIEF DESCRIPTION OF THE DRAWINGS

FIGS. 2A-2K are structural views of the package method of the present invention;

DETAILED DESCRIPTION OF THE PREFERRED EMBODIMENTS

The details and technical description of the present invention are further illustrated by the following embodiments, but it should be understood that the embodiments are merely for illustrative purposes, and should not be construed as limitative of the present invention.

Figure 1:
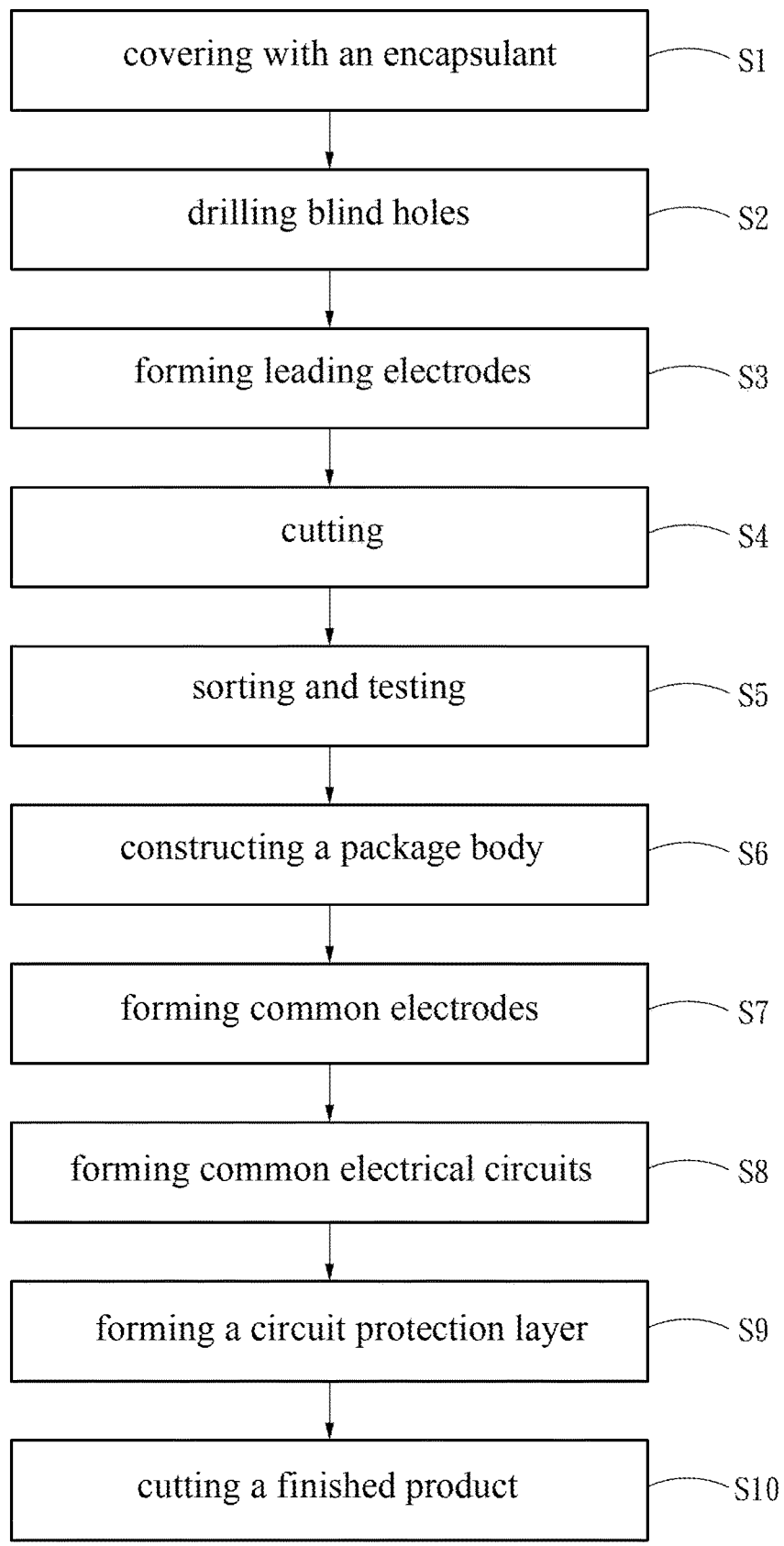
FIG. 1 is a flowchart of a package method of the present invention.
Figure 2A:
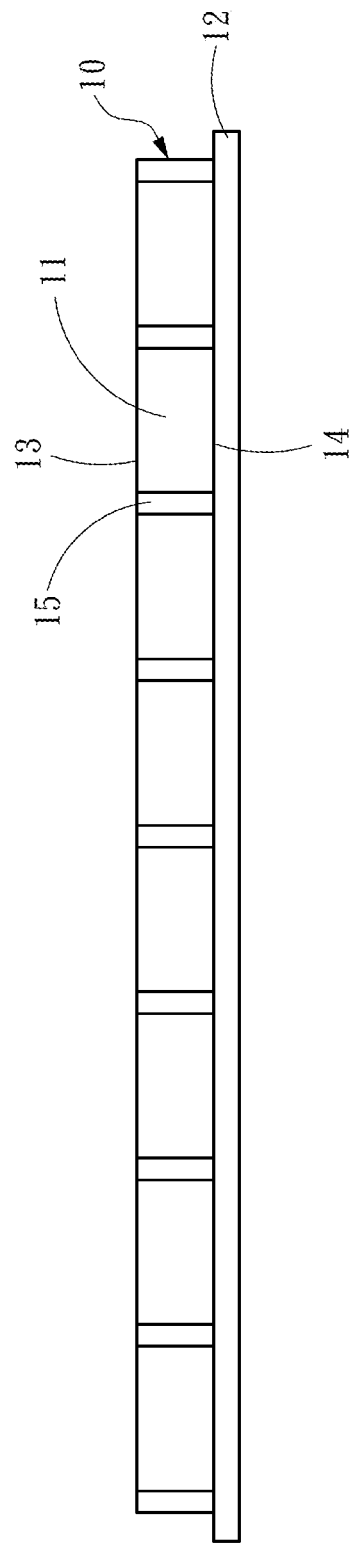

Referring to FIG. 1 and FIGS. 2A-2K, the present invention is a fan-out wafer level light-emitting diode package method for packaging a plurality of light-emitting diode chips 11. As shown in FIG. 2A, the plurality of light-emitting diode chips 11 are not separated and assembled to form a wafer 10. The wafer 10 is adhered on a wafer protective film 12. The plurality of light-emitting diode chips 11 have a first electrode 13 on an upper side and a second electrode 14 on a lower side. A cutting region 15 is between the plurality of light-emitting diode chips 11.

As shown in FIG. 1, the package method of the present invention comprises step S1: covering with an encapsulant, step S2: drilling blind holes, step S3: forming leading electrodes, step S4: cutting, step S5: sorting and testing, step S6: constructing a package body, step S7: forming common electrodes, step S8: forming common electrical circuits, and step S9: forming a circuit protection layer.

Figure 2B:
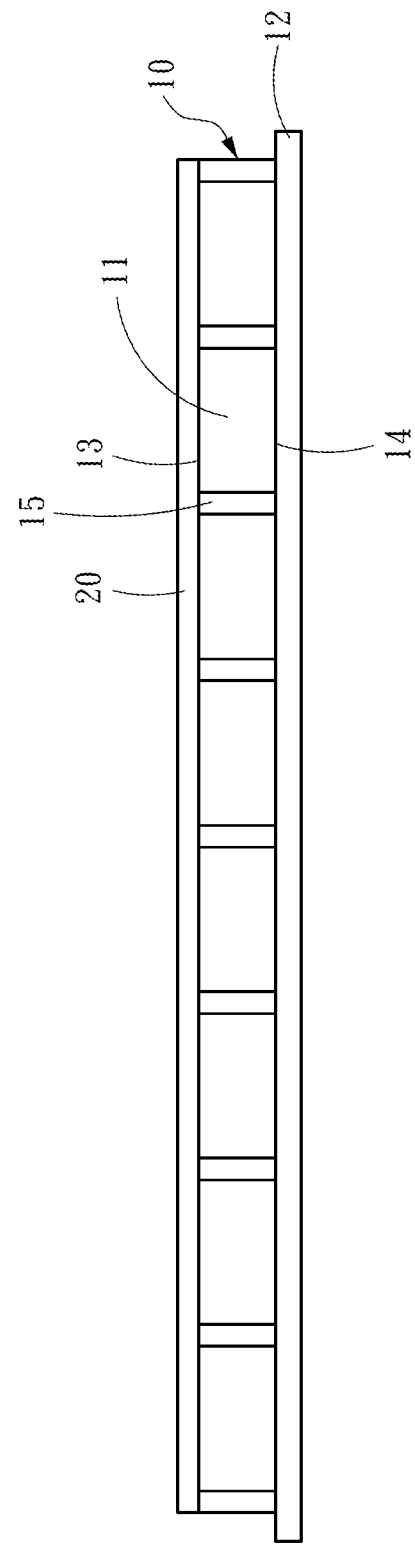

As shown in FIG. 2B, in step S1, a package surface layer 20 is covered on the wafer 10, and the package surface layer 20 covers the first electrodes 13 of the plurality of light-emitting diode chips 11. The package surface layer 20 can be selected from any one of an epoxy resin and a silicone resin, and the package surface layer 20 is formed on the wafer 10 by selectively using stamping, dispensing, or the like.

As shown in FIG. 2C, in step S2, drilling on the package surface layer 20 corresponding to positions of the light-emitting diode chips 11 to form a plurality of blind holes 21. The plurality of blind holes 21 expose the first electrodes 13 of the plurality of light-emitting diode chips 11. The drilling can be done in any manner selected from a laser and a drill bit, as long as the plurality of blind holes 21 can be formed to meet the requirements for application.

As shown in FIG. 2D, in step S3, the plurality of blind holes 21 are respectively filled with a conductive material to form a plurality of leading electrodes 22, and the plurality of leading electrodes 22 are electrically connected to the first electrodes 13 of the plurality of light-emitting diode chips 11 respectively. The conductive material is a conductive silver adhesive or a conductive nano silver adhesive.

Figure 2E:
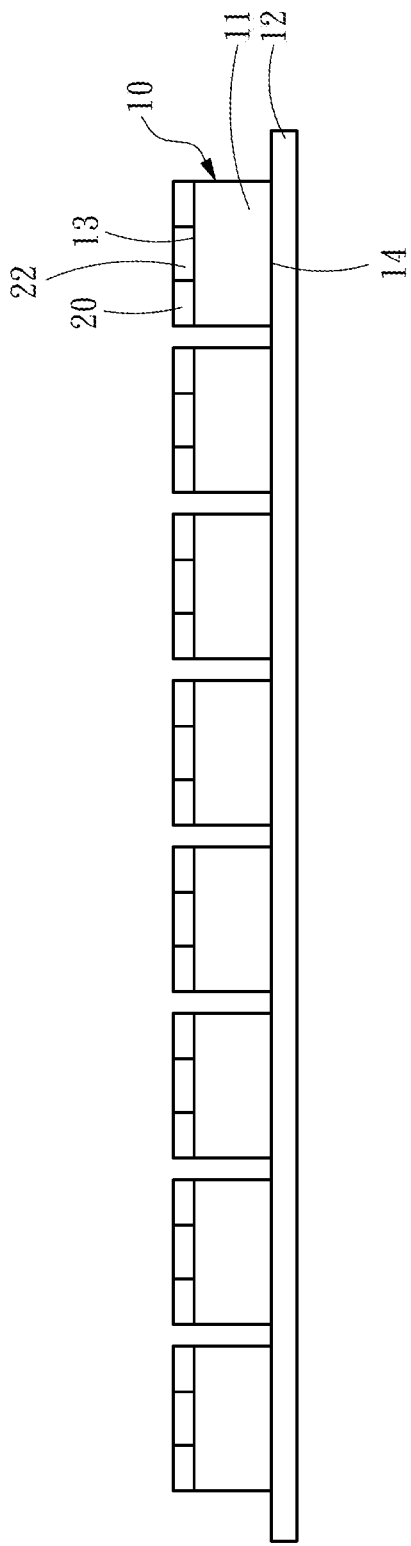

As shown in FIG. 2E, in step S4, cutting the wafer 10, which is cutting along the cutting region 15 to separate the plurality of light-emitting diode chips 11 into single individuals, and the cutting can be done by using techniques such as laser cutting, etc.

Figure 2F:
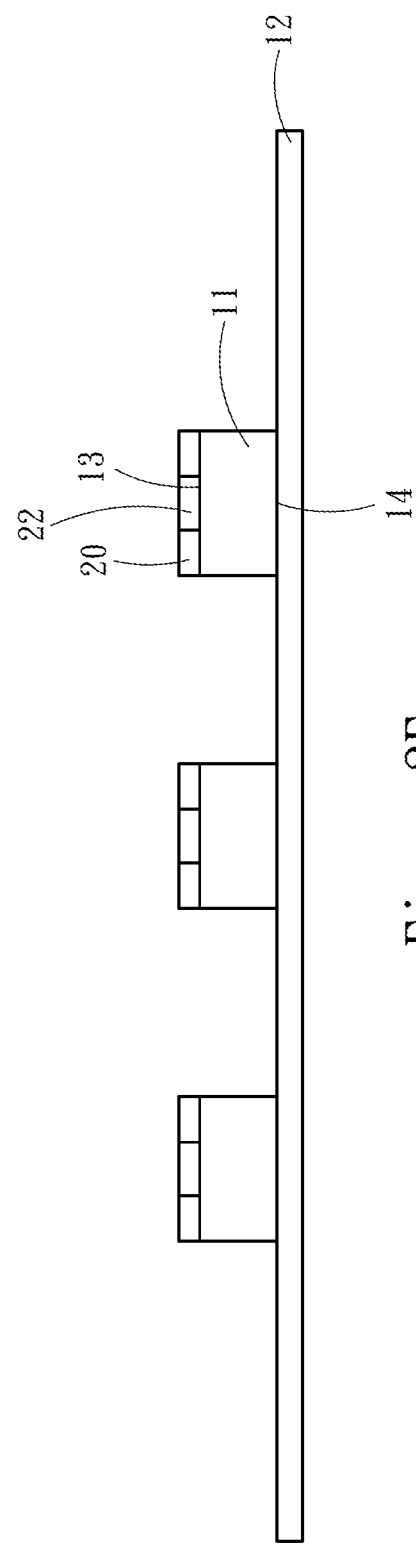

As shown in FIG. 2F, in step S5, the plurality of light-emitting diode chips 11 are tested to reject the damaged light-emitting diode chips 11, which is no different from the conventional chip test, and the purpose is to eliminate defective products. The present invention groups and rearranges the remaining light-emitting diode chips 11 on the wafer protective film 12. The wafer protective film 12 defines a plurality of package regions 30 (as shown in FIG. 2H), and the plurality of light-emitting diode chips 11 of a same group are located on the same package region 30. In this step, the grouping manner, the rearranging manner and the number of the light-emitting diode chips 11 are set according to subsequent requirements. As shown in FIG. 2F, there are three of the plurality of light-emitting diode chips 11 in the package region 30, and a wiring area required for packaging is reserved.

Figure 2G:
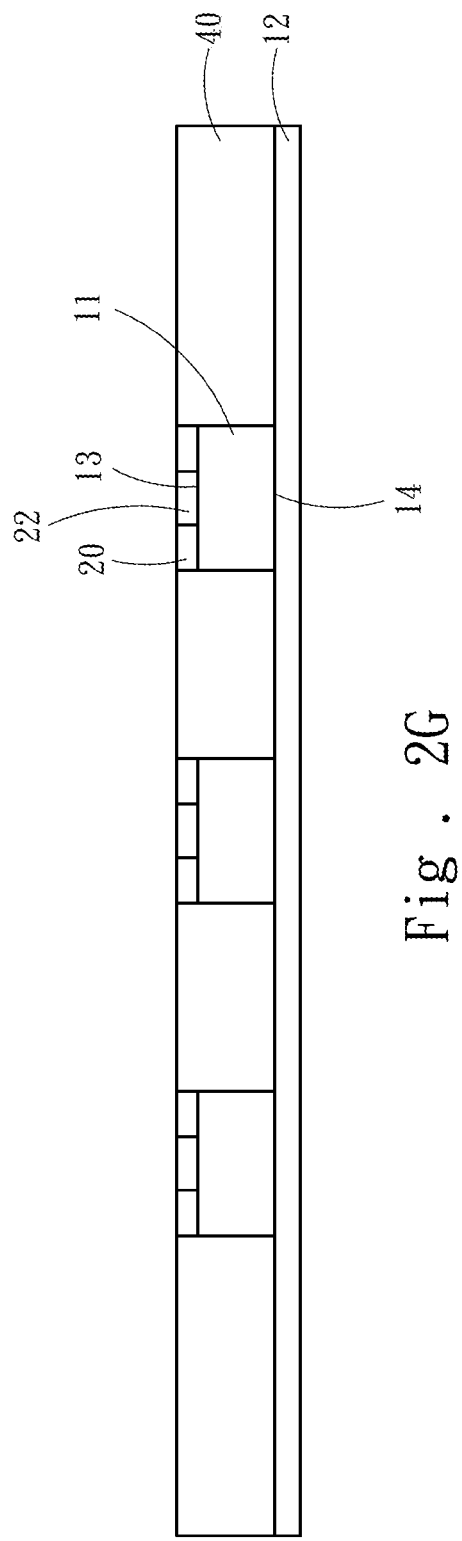
Figure 2H:
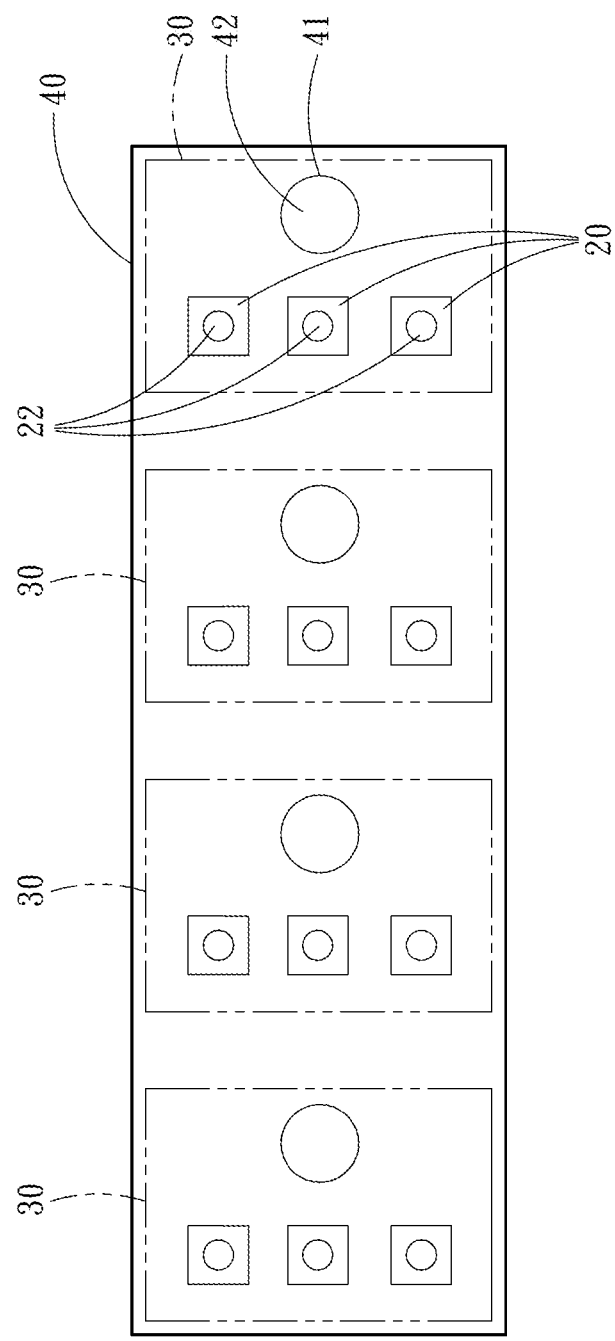

As shown in FIG. 2G, in step S6, a package layer 40 is formed on the wafer protective film 12, the package layer 40 covers sides of the plurality of light-emitting diode chips 11. The package layer 40 and the package surface layer 20 have a same height to form a coplane. A material of the package layer 40 can also be selected from any one of an epoxy resin and a silicone resin, and the package layer 40 is made by selectively using stamping, dispensing, or the like.

As shown in FIG. 2H, in step S7, drilling holes on the package layer 40 of each of the plurality of package regions 30 to form a plurality of through holes 41 on the package layer 40. The drilling method of the plurality of through holes 41 is selected from any one of a laser and a drill bit, and fill a conductive material in the plurality of through holes 41 to form a plurality of common electrodes 42. The conductive material is also a conductive silver adhesive or a conductive nano silver adhesive.

Figure 2I:
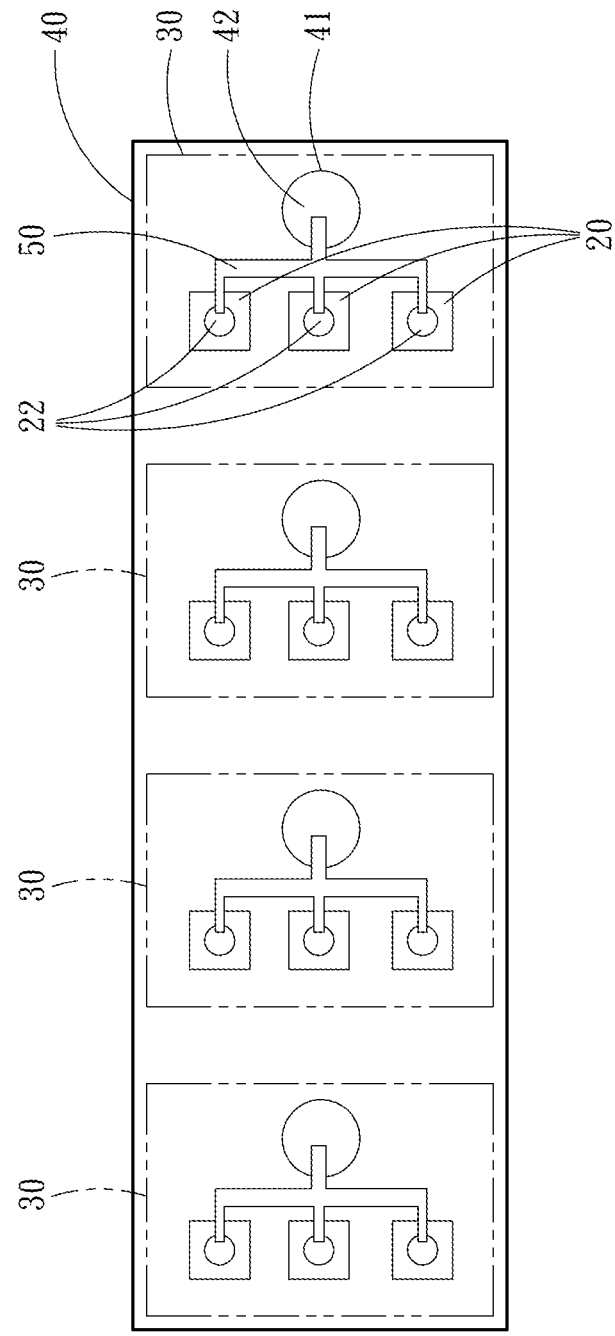

As shown in FIG. 2I, in step S8, simultaneously printing a plurality of common electrical circuits 50 on the package layer 40 and the package surface layer 20, and each of the plurality of package regions 30 is correspondingly disposed with one of the common electrical circuits 50. The common electrical circuit 50 is electrically connected to the common electrode 42 and the leading electrodes 22 in the package region 30.

Figure 2J:
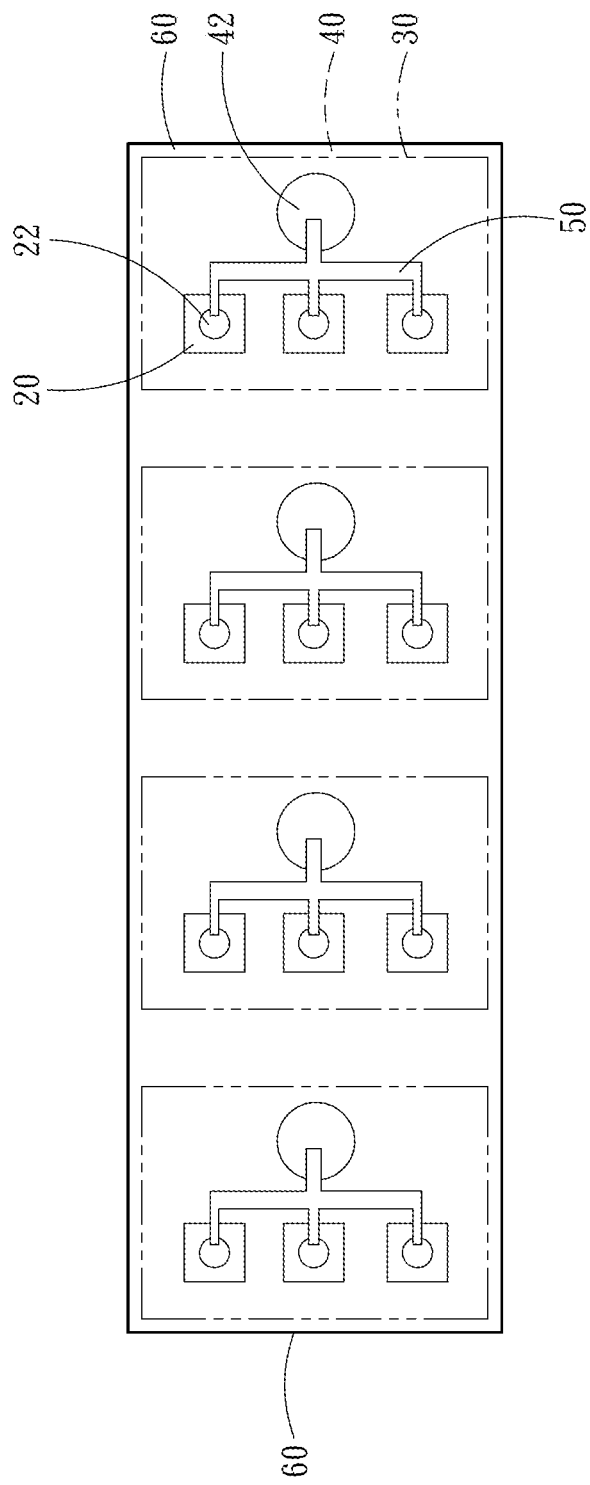

As shown in FIG. 2J, in step S9, a circuit protection layer 60 is formed on the package layer 40 and the package surface layer 20, and the circuit protection layer 60 covers the leading electrodes 22. The common electrodes 42 and the common electrical circuits 50 on the package layer 40 and the package surface layer 20.

Figure 2K:
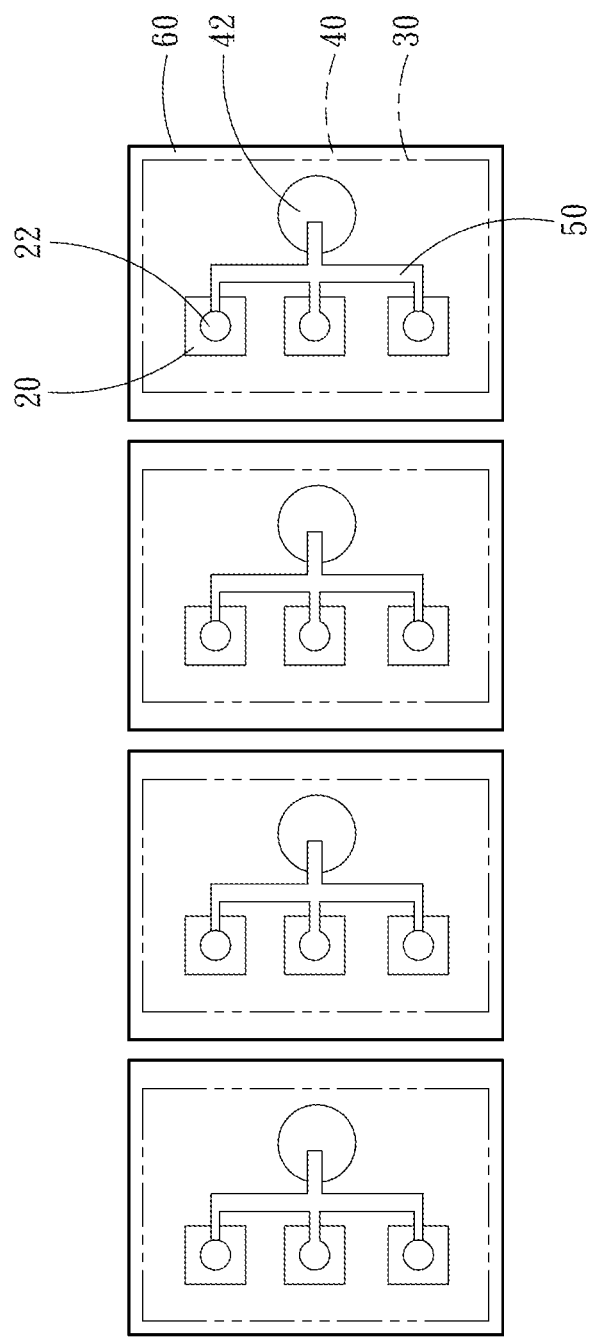

As shown in FIG. 2K, in addition, the present invention can further comprise a step S10: cutting a finished product. The package layer 40 is cut based on a cutting unit defined by the plurality of package region 30.

Moreover, when an illuminating color of the light-emitting diode chips 11 is monochromatic, a higher brightness can be provided if a larger number of the light-emitting diode chips 11 are in one of the package regions 30. When an illuminating color of the light-emitting diode chips 11 is respectively selected from any one of red, green and blue, there can be three of the light-emitting diode chips 11 of a same group, and an illuminating color of the three light-emitting diode chips 11 is red, green and blue respectively, which can be mixed to form a white light source.

Figure 4:
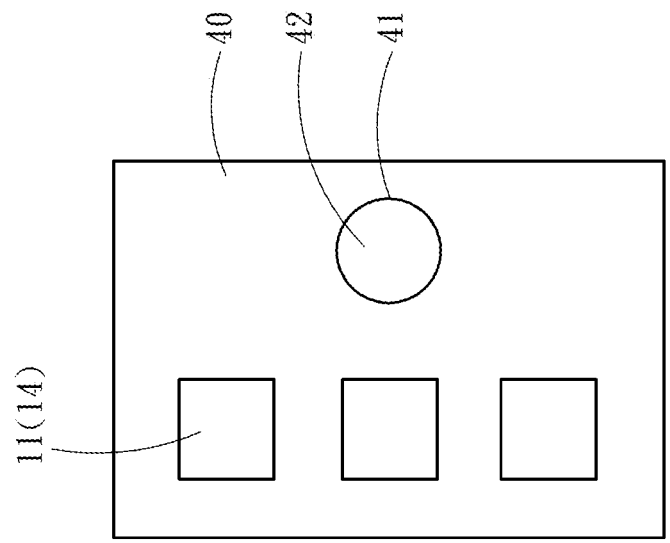
FIG. 4 is a bottom view of the package structure of the present invention.
Figure 3:
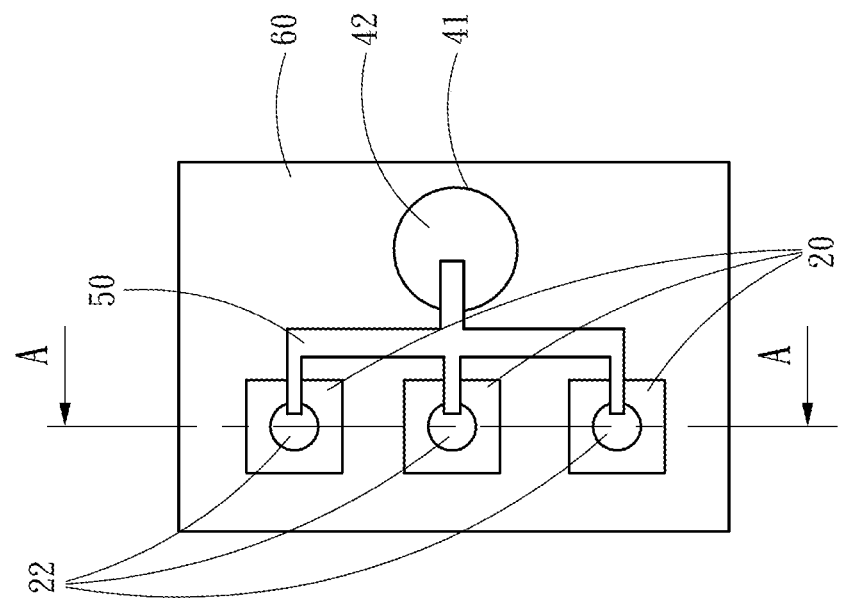
FIG. 3 is a top view of a package structure of the present invention.
Figure 5:
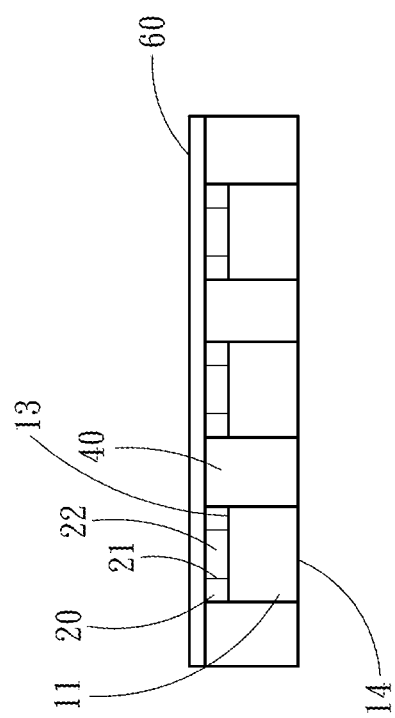
FIG. 5 is a cross-sectional view taken along line A-A of FIG. 3 of the present invention.

Please refer to FIG. 3, FIG. 4 and FIG. 5 together, which is a fan-out wafer level light-emitting diode package structure according to step S1-step S10 of the above method. The fan-out wafer level light-emitting diode package structure comprises at least two of the light-emitting diode chips 11, the package surface layer 20, at least two of the leading electrodes 22, the package layer 40, the common electrodes 42, the common electrical circuits 50, and the circuit protection layer 60. Each of the light-emitting diode chips 11 have the first electrode 13 on the upper side and the second electrode 14 on the lower side. The package surface layer 20 covers the first electrodes 13 of the light-emitting diode chips 11. The package surface layer 20 has at least two of the blind holes 21, and the blind holes 21 penetrate through the package surface layer 20 corresponding to the positions of the light-emitting diode chips 11, and expose the first electrodes 13 of the light-emitting diode chips 11. The leading electrodes 22 are filled in the blind holes 21, and the leading electrodes 22 are respectively electrically connected to the first electrodes 13 of the light-emitting diode chips 11, wherein there are three of the light-emitting diode chips 11, the leading electrodes 22 and the blind holes 21 drawn in the figures for representation.

The package layer 40 covers the sides of the light-emitting diode chips 11. The package layer 40 and the package surface layer 20 have a same height to form a coplane, and the package layer 40 has the through hole 41 penetrating through the two sides. The common electrode 42 is filled in the through hole 41. The common electrical circuit 50 is disposed on the package layer 40 and the package surface layer 20, and the common electrical circuit 50 is electrically connected to the common electrode 42 and the leading electrodes 22. The circuit protection layer 60 covers the leading electrodes 22, the common electrode 42 and the common electrical circuit 50 on the package layer 40 and the package surface layer 20.

With the structure as described above, the advantages of the present invention include at least:

1. By using the wafer protective film as a carrier for packaging, the costs can be saved without using a package substrate.

2. By utilizing printing technology and simultaneously printing the common electrical circuits, the speed of process production can be improved.

3. The manufactured package structure can be directly on board by SMT method, thereby improving production efficiency.

What is claimed is:

1. A fan-out wafer level light-emitting diode package method for packaging a plurality of light-emitting diode chips, wherein the plurality of light-emitting diode chips are not separated and assembled to form a wafer, the wafer is adhered on a wafer protective film, and each of the plurality of light-emitting diode chips has a first electrode on an upper side and a second electrode on a lower side, the package method comprising:

step S1: covering with an encapsulant, covering the wafer with a package surface layer, and the package surface layer covering the first electrodes of the plurality of light-emitting diode chips;

step S2: drilling blind holes, drilling on the package surface layer corresponding to positions of the plurality of light-emitting diode chips to form the blind holes, and the blind holes exposing the first electrodes of the plurality of light-emitting diode chips;

step S3: forming leading electrodes, filling a conductive material in the blind holes respectively to form the leading electrodes, and electrically connecting the leading electrodes to the first electrodes of the plurality of light-emitting diode chips respectively;

step S4: cutting, cutting the wafer to separate the plurality of light-emitting diode chips into single individuals;

step S5: sorting and testing, testing the plurality of light-emitting diode chips, rejecting the damaged light-emitting diode chips, grouping and rearranging the remaining light-emitting diode chips on the wafer protective film, defining the wafer protective film into a plurality of package regions, and locating the plurality of light-emitting diode chips of a same group on the same package region;

step S6: constructing a package body, forming a package layer on the wafer protective film, the package layer covering sides of the plurality of light-emitting diode chips, and the package layer and the package surface layer having a same height to form a coplane;

step S7: forming common electrodes, drilling holes on the package layer of each of the plurality of package regions to form a plurality of through holes on the package layer, and filling a conductive material in the through holes to form the common electrodes;

step S8: forming common electrical circuits, simultaneously printing the common electrical circuits on the package layer and the package surface layer, disposing one of the common electrical circuits on each of the plurality of package regions correspondingly, and electrically connecting the common electrical circuit to the common electrodes and the leading electrodes in the package region; and step S9: forming a circuit protection layer, forming the circuit protection layer on the package layer and the package surface layer, and the circuit protection layer covering the leading electrodes, the common electrodes and the common electrical circuits on the package layer and the package surface layer.

2. The fan-out wafer level light-emitting diode package method as claimed in claim 1, wherein further comprising a step S10: cutting a finished product, cutting the package layer into a cutting unit defined by the package region.

3. The fan-out wafer level light-emitting diode package method as claimed in claim 1, wherein an illuminating color of the plurality of light-emitting diode chips is monochromatic.

4. The fan-out wafer level light-emitting diode package method as claimed in claim 1, wherein an illuminating color of the plurality of light-emitting diode chips is respectively selected from any one of red, green and blue.

5. The fan-out wafer level light-emitting diode package method as claimed in claim 4, wherein there are three of the plurality of light-emitting diode chips of a same group, and the illuminating color of the three light-emitting diode chips is red, green and blue respectively.

6. The fan-out wafer level light-emitting diode package method as claimed in claim 1, wherein the drilling method of step S2 and step S7 is selected from any one of a laser and a drill bit.

7. A fan-out wafer level light-emitting diode package structure, the structure comprising:

at least two light-emitting diode chips, each of the light-emitting diode chips having a first electrode on an upper side and a second electrode on a lower side;

a package surface layer covering the first electrodes of the light-emitting diode chips, the package surface layer having at least two blind holes, the blind holes penetrating through the package surface layer corresponding to positions of the light-emitting diode chips, and exposing the first electrodes of the light-emitting diode chips;

at least two leading electrodes filled in the blind holes and respectively electrically connected to the first electrodes of the light-emitting diode chips;

a package layer covering sides of the light-emitting diode chips, the package layer and the package surface layer having a same height to form a coplane, and the package layer having a through hole penetrating through two sides;

a common electrode filled in the through hole;

a common electrical circuit disposed on the package layer and the package surface layer, and the common electrical circuit being electrically connected to the common electrodes and the leading electrodes; and a circuit protection layer covering the leading electrodes, the common electrode and the common electrical circuit on the package layer and the package surface layer.

8. The fan-out wafer level light-emitting diode package structure as claimed in claim 7, wherein an illuminating color of the light-emitting diode chips is monochromatic.

9. The fan-out wafer level light-emitting diode package structure as claimed in claim 7, wherein the illuminating color of the light-emitting diode chips is respectively selected from any one of red, green and blue.

10. The fan-out wafer level light-emitting diode package structure as claimed in claim 9, wherein there are three of the light-emitting diode chips, and an illuminating color of the three light-emitting diode chips is red, green and blue respectively.

* * * * *